US008295056B2

(12) United States Patent
Andry et al.

(10) Patent No.: US 8,295,056 B2
(45) Date of Patent: Oct. 23, 2012

(54) SILICON CARRIER STRUCTURE AND METHOD OF FORMING SAME

(75) Inventors: Paul Stephen Andry, Yorktown Heights, NY (US); Harm Peter Hofstee, Austin, TX (US); George A. Katopis, Poughkeepsie, NY (US); John Ulrich Knickerbocker, Hopewell Junction, NY (US); Robert K. Montoye, Yorktown Heights, NY (US); Chirag S. Patel, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 498 days.

(21) Appl. No.: 12/507,591

(22) Filed: Jul. 22, 2009

(65) Prior Publication Data

US 2011/0019368 A1    Jan. 27, 2011

(51) Int. Cl.
*H05K 7/00* (2006.01)
(52) U.S. Cl. ... 361/760; 361/748; 361/782; 361/679.01; 361/750; 361/679.31
(58) Field of Classification Search .................. 361/760, 361/782, 748, 820–822, 728, 734–738, 750, 361/679.31, 679.32, 679.01, 679.02
See application file for complete search history.

(56) References Cited

U.S. PATENT DOCUMENTS

| 5,432,913 | A | * | 7/1995 | Smits et al. | 713/2 |
| 5,941,447 | A | * | 8/1999 | Chu et al. | 228/180.21 |
| 6,154,834 | A | * | 11/2000 | Neal et al. | 712/248 |
| 6,388,207 | B1 | * | 5/2002 | Figueroa et al. | 174/262 |
| 6,979,841 | B2 | * | 12/2005 | Ohtani | 257/72 |
| 7,303,406 | B2 | * | 12/2007 | Asano et al. | 439/76.2 |
| 7,888,808 | B2 | * | 2/2011 | Suzuki et al. | 257/786 |
| 8,051,253 | B2 | * | 11/2011 | Okin et al. | 711/154 |
| 2004/0136166 | A1 | * | 7/2004 | Sullivan | 361/728 |
| 2006/0244122 | A1 | * | 11/2006 | Fujita et al. | 257/691 |
| 2006/0290376 | A1 | * | 12/2006 | Kao | 326/26 |

* cited by examiner

*Primary Examiner* — Hoa C Nguyen
(74) *Attorney, Agent, or Firm* — Chau & Associates, LLC; Louis J. Percello, Esq.

(57) ABSTRACT

A silicon carrier structure for electronic packaging includes a base substrate, a silicon carrier substrate disposed on the base substrate, a memory chip disposed on the silicon carrier substrate, a microprocessor chip disposed on the silicon carrier substrate, an input/output chip disposed on the silicon carrier substrate, and a clocking chip disposed on the silicon carrier substrate.

15 Claims, 3 Drawing Sheets

SILICON CARRIER STRUCTURE AND METHOD OF FORMING SAME

BACKGROUND OF THE INVENTION

1. Technical Field

The present disclosure relates to electronic systems and, more particularly, to packaging of electronic systems.

2. Discussion of Related Art

In the computer industry, packaging methods include building circuits forming a system on a single die, referred to as a SoC (System on Chip) device, building circuits forming a system on two or more chips according to chip device type, or packaging each chip into an electronic package and later assembling them on an organic substrate or a printed circuit board (PCB). Chips, such as SoC devices, may be used for high-performance computing solutions or complex combined technology solutions. SoC implementations can result in large die sizes and drive semiconductor die costs up due to additional process steps and complexity. The ability to process multiple complex mixed logic and memory devices as well as other technologies on one wafer may not lead to a robust, high-yield, and low-cost product due to, for example, the complexity of each function not being common with other circuitry or unique processes to obtain system-level functionality.

The gap between processor speeds and memory performance, sometimes referred to as the "memory wall" problem, has become an obstacle to improved computer system performance. One reason for this difficulty is that the memory system resides "off-chip" and packaging constraints limit what can be accomplished to improve the average time to access memory.

One proposed approach to solve this difficulty uses multiple cache levels integrated into a single processor die. This approach has the disadvantage that the processor die becomes large and therefore expensive. Typically, high-end processor chips are spatially dominated by memory allocated for these cache levels.

Memory latency, which refers to the time between the initiation of a memory request and its completion, and bandwidth, which refers to the rate at which the memory system can service requests from the processor, are closely related. Bandwidth is one bottleneck in the performance of a memory system. It is desirable to ensure that the flow of data from memory to the processor is fully balanced, thus increasing overall performance by making efficient use of the processor. One approach to balancing the flow of data is to place a large amount of memory in close proximity to the processor and to allow that memory to communicate with the processor through a wider bus than is typically used (e.g., 1024 channels instead of 16, 32 or 64 running at DDR). Attempting to embed a large amount of memory on the processor chip, as proposed in some SoC designs, would take up chip area while simultaneously driving overall yield down. However, due to aggressive groundrule targets in the future and die yield considerations, it is advantageous for the processor to be as small as is practically permitted by power density and thermal design considerations.

Various techniques to provide redundancy in wiring for interconnection of transistors and to provide a module level cooling solution by leveraging a silicon substrate use a passive silicon substrate as an interconnection to a system.

Microwave silicon devices and low loss transmission lines may be integrated using a highly doped silicon wafer by placing active circuits in single crystal silicon and transmission lines using polycrystalline silicon. This method provides means for microwave transmission between moat regions with active devices and high resistivity regions surrounding each moat region on the semiconductor device but does not provide for modular design (reuse of prior designs), lower power or improved performance at lower cost for system level applications.

Monolithic microwave integrated circuits (MMIC) use high resistivity silicon which may have MMIC placed into etched recesses in the silicon. In this case, gallium arsenide (GaAs) devices are placed into the etched recesses and then interconnected to provide function. For example, MMIC solutions have been used to connect GaAs for microwave applications.

Stacked IC structures, which may provide increased integration due to historical limitations with SOI (silicon on insulator) technology, have been used for memory applications. For example, a method of forming a three-dimensional stacked IC on a base plate is known. A three-dimensional stacked IC may include a unit semiconductor IC, which has constituent ICs formed on one or both surfaces of a substrate. By stacking a plurality of unit ICs on the base plate, a very large scale IC can be fabricated. This method can be applied to the fabrication of a ROM structure such as a PROM or MASK ROM, using single unit semiconductor ICs, wherein a wiring for the ROM can be formed on the second surface of the substrate.

In these methods for producing chip-stacks, 3D integration of die is typically limited to memory products including Flash, SRAM and DRAM, which are edge wire-bonded. These methods do not address the memory bottleneck.

Therefore, a need exists for new packaging techniques to increase the bandwidth to main memory while also reducing the latency to memory.

SUMMARY OF THE INVENTION

According to an exemplary embodiment of the present invention, a silicon carrier structure for electronic packaging includes a base substrate, a silicon carrier substrate disposed on the base substrate, a memory chip disposed on the silicon carrier substrate, a microprocessor chip disposed on the silicon carrier substrate, an input/output chip disposed on the silicon carrier substrate, and a clocking chip disposed on the silicon carrier substrate.

According to an exemplary embodiment of the present invention, a method of forming a silicon carrier structure includes etching a wafer to form etched vertical holes in the wafer, forming via insulation and metallization using thermal oxidation, forming back-end-of-line wiring to form X-Y wiring interconnections for space transformation connections, power and ground, forming at least one of surface pads, microbumps or copper interconnections, and dicing the wafer to produce one or more silicon carrier structures.

The present invention will become readily apparent to those of ordinary skill in the art when descriptions of exemplary embodiments thereof are read with reference to the accompanying drawings.

DESCRIPTION OF EXEMPLARY EMBODIMENTS

Figure 1:
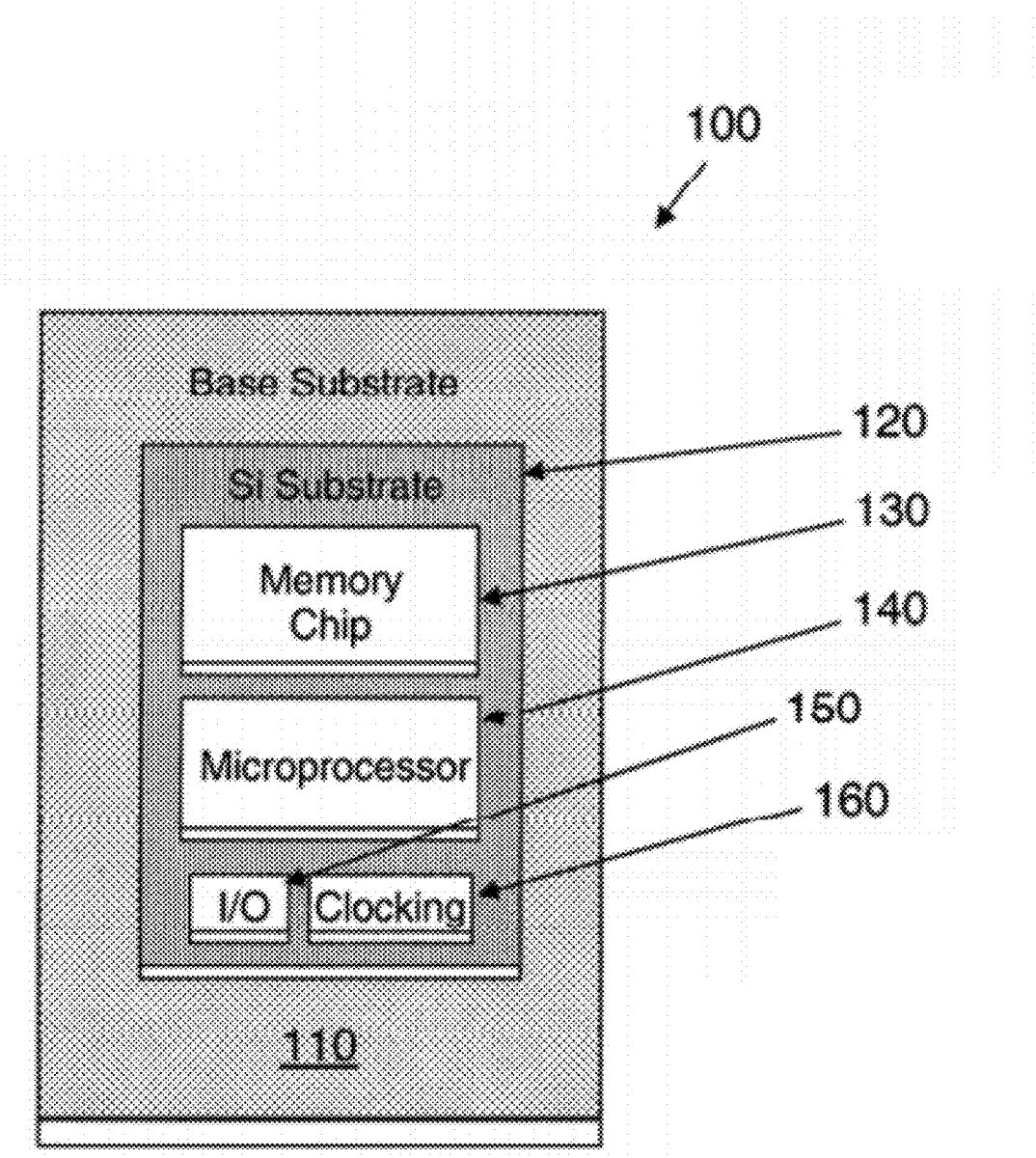
FIG. 1 is a block diagram schematically illustrating a silicon carrier structure, according to an exemplary embodiment of the present invention.

Hereinafter, exemplary embodiments of the present invention will be described with reference to the accompanying drawings.

Various exemplary embodiments of the present invention include a surface mountable integrated circuit fabricated in a silicon carrier or wafer with interconnection to silicon chips or connection with a printed circuit board as well as a structure and method for high-performance electronic packaging assembly using a silicon interposer to connect microprocessor and memory chips.

A silicon carrier structure, according to an exemplary embodiment of the present invention, includes flip-chips attached without the use of engineering pad changes between the semiconductor devices, creating a shorter path for interconnection and permitting testing and changes on the opposite side of the substrate, and permitting reduced length connections. Further, top surface repair may be substantially avoided.

Various exemplary embodiments of the present invention include a plurality of semiconductor chips and integrate the packaging with active and passive circuitry using a silicon carrier with active circuits, through silicon (Si) via technology and passive circuitry and wiring to improve performance, modular design and lower power to benefit the total solution with a lower cost product.

An exemplary embodiment of the present invention includes integrated active circuits in the package and low inductance through Si vias, and may improve performance at higher frequencies. Mixed semiconductor technologies can be supported, each using cost efficient semiconductor processing. For example, simple die can be fabricated independently, such as SiGe die, memory die, microprocessor die, analog die, optoelectronic die, etc.

A silicon carrier structure, according to an exemplary embodiment of the present invention, may lower the power needed by the product and optionally use simple (I/O) input/output drivers and receivers that consume low power due to reduced interconnection length, smaller feature sizes and/or improved electrical shielding for signals enhancing signal integrity and signal transmission between circuits at a given length.

A silicon carrier structure, according to an exemplary embodiment of the present invention, leverages options for passive circuits such as through-silicon-vias, wiring, integrated fuses, capacitors, inductors and resistors and/or active circuits in silicon carrier packaging which can provide repeaters that boost signal swing, clocking distribution for multiple die placed on one or more locations on or in a silicon carrier. A silicon carrier structure, according to an exemplary embodiment of the present invention, improves the mechanical and reliability properties of silicon carrier package by use of coefficient of expansion match or improved match with balancing stress or reducing stress in a silicon carrier by using X-Y wiring and ground planes on one or more sides of the silicon carrier, use of stress balancing depositions such as SiOx, SiNx, TaN or like materials, which have ability to improve wafer level stress during wafer processing and in the final chip(s)-package(s) assemblies, and/or improve reliability for use in advanced silicon technology which may employ copper metallurgy and low K dielectric materials which typically have lower modulus and structural mechanical properties even though they may possess superior electrical properties to improve performance or reduce power consumption.

FIG. 1 is a block diagram schematically illustrating a silicon carrier structure, according to an exemplary embodiment of the present invention. Referring to FIG. 1, the silicon carrier structure 100 includes a base substrate 110, a silicon carrier substrate 120, a memory chip 130, a microprocessor chip 140, an I/O chip 150, and a clocking chip such as a phase lock loop (PLL) chip 160.

The silicon carrier structure 100 may include active devices for use in any function such as to provide driver or repeater or buffer for signal propagation and may be optimized to minimize total power or distribute power or to manage hot spots by reducing power in or about certain areas on one or more chips, one or more Si carriers in a module and for associate packaging. The silicon carrier structure 100 may include active devices such as memory in close proximity to one or more microprocessors or other architectures. The silicon carrier structure 100 may include active devices such as ESD diodes to protect circuits.

The silicon carrier structure 100 may utilize polymer or filled polymer adhesives in addition to electrical interconnections such as solder to provide structure and or thermal enhancement between semiconductors, silicon carriers and/ or supporting packages and or boards.

The silicon carrier structure 100 may be co-designed between chip(s), silicon carrier(s) and packaging to optimize for low cost and high yield, for wiring, performance and/or power.

The silicon carrier structure 100 may be utilized for applications such as a virtual chip, high bandwidth microprocessor (s), communications, networking, games, automotive, military, super computer, server, pervasive solution or alternate application.

The silicon carrier structure 100 may be fabricated using semiconductor tooling to create conductive and insulating structures in X, Y and Z dimensions.

The base substrate 110 may comprise, but is not limited to, a ceramic base substrate, organic base substrate or a printed wiring board.

The silicon carrier substrate 120 may comprise of active and passive circuitry and/or components to enhance the silicon carrier function. Active circuitry may include active transistors used to support signal boost for performance improvement, to lower power consumption on-chip compared to large single signal drivers on-chip, to distribute power off-chip to permit increased power density designed for microprocessor performance enhancement rather than current level of shared power density for microprocessor performance and I/O drivers for off-chip connections though traditional interconnections which require larger driver power. Passive components may include electrostatic discharge (ESD) protection devices, integrated capacitors, resistors and inductors for voltage regulation and power distribution at one or more voltage levels.

The silicon carrier substrate 120 may include surface pads and features that allow the assembly with close proximity between multiple chips such as microprocessor and memory and fine pitch interconnections that assure high bandwidth interface between chips. Fine pitch interconnections may have a pitch such as at 50 micron pitch, 20 micron pitch, <4 micron pitch. The fine pitch interconnections may have a large pitch such as between about 100 microns and 200 microns. In an exemplary embodiment of the present invention, the fine pitch interconnections have a pitch in the range of about 5 microns to about 50 microns pitch.

The silicon carrier substrate 120 may include single or multiple wiring levels fabricated using bulk epitaxial developed silicon, use of SiOx dielectric, polyimide dielectric, or alternate low k dielectric, and/or metallic elements such as copper, aluminum, etc. The substrate 120 may include integrated decoupling capacitance with trench and/or planar capacitors with use of SiOx, SiNx or high k dielectrics or alternate dielectric materials, where needed to support high K, low inductance decoupling.

The silicon carrier substrate 120 may include one or multiple levels of wiring as well as one or multiple through-vias and micro bumps for signal propagation as well as power and ground distribution and shielding for signal lines.

The silicon carrier substrate 120 may include active devices for use in any function such as integrated optical drivers or receivers or devices added to the silicon carrier for optical interconnection on and/or off module.

The silicon carrier substrate 120 may utilize conductors such as metals, for example, copper, nickel, solder, Ti, Ta, TiW, Cr, Cr/Cu, Ni, Au, or composite metals, metal-containing polymers or alternate conductors structures to connect chip to Si carrier and/or silicon carrier to base substrate 110 and/or to connect multiple silicon carrier substrates on a base substrate.

The silicon carrier substrate 120 may contain one or more micron size connections which are less than 200 microns in size where said structures may be minimized in size to result into small parasitic capacitance (such as with connections of less than 1 micron to 100 micron height and/or diameter of less than 1 micron to over 200 microns) to support high speed and high bandwidth communication between multiple chips assembled on silicon carrier substrate.

The memory chip 130 may comprise of a single die or multiple stacked die memory chip such as Flash, SRAM, DRAM or MRAM.

The microprocessor chip 140 may comprise of single core or multiple core microprocessor chip.

The I/O chip 150 may comprise of low or high speed input/output driver/receiver chip.

The clocking chip 160 may comprise of clocking chip such as a phase lock loop (PLL) chip.

Figure 2:
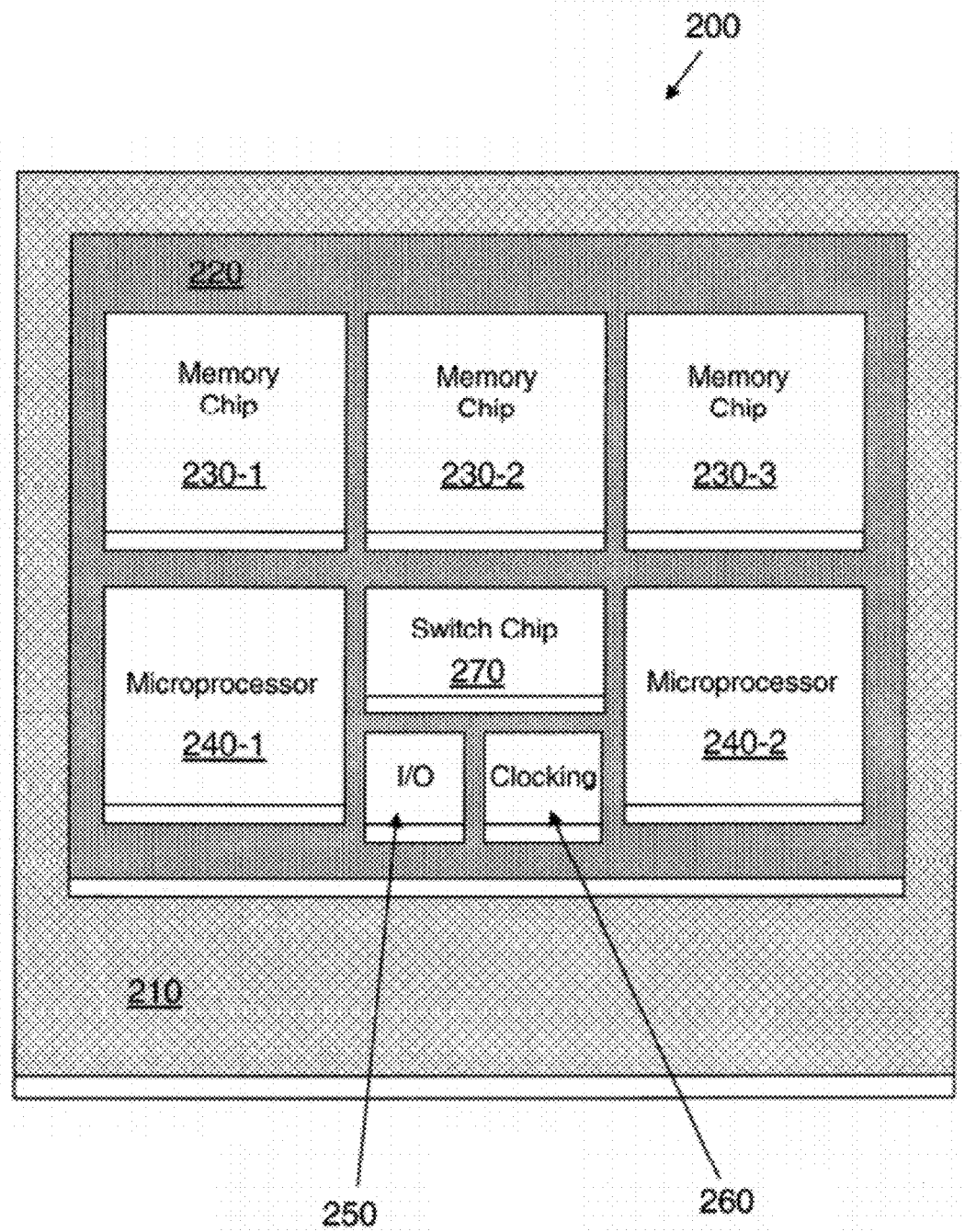
FIG. 2 is a block diagram schematically illustrating a silicon carrier structure, according to an exemplary embodiment of the present invention.

FIG. 2 is a block diagram schematically illustrating a silicon carrier structure, according to an exemplary embodiment of the present invention. Referring to FIG. 2, the silicon carrier structure 200 includes a base substrate 210, a silicon carrier substrate 220, memory chips 230-1, 230-2 and 230-3, microprocessor chips 240-1 and 240-2, I/O chip 250, PLL chip 260, and switch chip 270.

The silicon carrier structure 200 may include active devices for use in any function such as to provide driver or repeater or buffer for signal propagation and may be optimized to minimize total power or distribute power or to manage hot spots by reducing power in or about certain areas on one or more chips, one or more Si carriers in a module and for associate packaging. The silicon carrier structure 200 may include active devices such as memory in close proximity to one or more microprocessors or other architectures. The silicon carrier structure 200 may include active devices such as ESD diodes to protect circuits.

The silicon carrier structure 200 may utilize, polymer or filled polymer adhesives in addition to electrical interconnections such as solder, to provide structure and or thermal enhancement between semiconductors, silicon carriers and or supporting packages and or boards.

The silicon carrier structure 200 may be co-designed between chip(s), silicon carrier(s) and packaging to optimize for low cost and high yield, for wiring, performance and/or power.

The silicon carrier structure 200 may be utilized for applications such as a virtual chip, high bandwidth microprocessor(s), communications, networking, games, automotive, military, super computer, server, pervasive solution or alternate application.

The silicon carrier structure 200 may be fabricated using semiconductor tooling to create conductive and insulating structures in X, Y and Z dimensions.

The base substrate 210 may comprise of, but is not limited to, a ceramic base substrate, organic base substrate or a printed wiring board.

The silicon carrier substrate 220 may comprise of active and passive circuitry and/or components to enhance the silicon carrier function. Active circuitry may include active transistors used to support signal boost for performance improvement, to lower power consumption on chip compared to large single signal drivers on chip, to distribute power off chip to permit increased power density designed for microprocessor performance enhancement rather than current level of shared power density for microprocessor performance and I/O drivers for off chip connections though traditional interconnections which require larger driver power. Passive components may include electrostatic discharge (ESD) protection devices, integrated capacitors, resistors and inductors for voltage regulation and power distribution at one or more voltage levels.

The silicon carrier substrate 220 may include surface pads and features that allow the assembly with close proximity between multiple chips such as microprocessor and memory and fine pitch interconnections that assure high bandwidth interface between chips.

The silicon carrier substrate 220 may include single or multiple wiring levels fabricated using bulk epitaxial developed silicon, use of SiOx dielectric, polyimide dielectric, or alternate low k dielectric, and/or metallic elements such as copper, aluminum, etc. The substrate 220 may include integrated decoupling capacitance with trench and/or planar capacitors with use of SiOx, SiNx or high k dielectrics or alternate dielectric materials, where needed to support high K, low inductance decoupling.

The silicon carrier substrate 220 may include one or multiple levels of wiring as well as one or multiple through-vias and micro bumps for signal propagation as well as power and ground distribution and shielding for signal lines.

The silicon carrier substrate 220 may include active devices for use in any function such as integrated optical drivers or receivers or devices added to the silicon carrier for optical interconnection on and/or off module.

The silicon carrier substrate 220 may utilize conductors such as metals, for example, copper, nickel, solder, Ti, Ta, TiW, Cr, Cr/Cu, Ni, Au, or composite metals, metal-containing polymers or alternate conductors structures to connect chip to Si carrier and/or silicon carrier to base substrate 210 and/or to connect multiple silicon carrier substrates on a base substrate.

The silicon carrier substrate 220 may contain one or more micron size connections which are less than 200 microns in size where said structures may be minimized in size to result into small parasitic capacitance (such as with connections of less than 1 micron to 100 micron height and/or diameter of less than 1 micron to over 200 microns) to support high speed and high bandwidth communication between multiple chips assembled on silicon carrier substrate.

The memory chip 230-1, 230-2, and 230-3 may comprise of one or more single die or multiple stacked die memory chip(s) such as flash, static random access memory (SRAM), dynamic random access memory (DRAM) or magnetoresistive random access memory (MRAM).

The microprocessor chip 240-1 and 240-2 may comprise of single core or multiple core singular or multiple stacked microprocessor chip(s).

The I/O chip 250 may comprise of low or high speed singular or multiple stacked input/output driver/receiver chip(s).

The clocking chip 260 may comprise of singular or multiple stacked clocking chip(s) such as a PLL.

The switch chip 270 may comprise of singular or multiple stacked switch chip(s) such as a crossbar switch.

Figure 3:
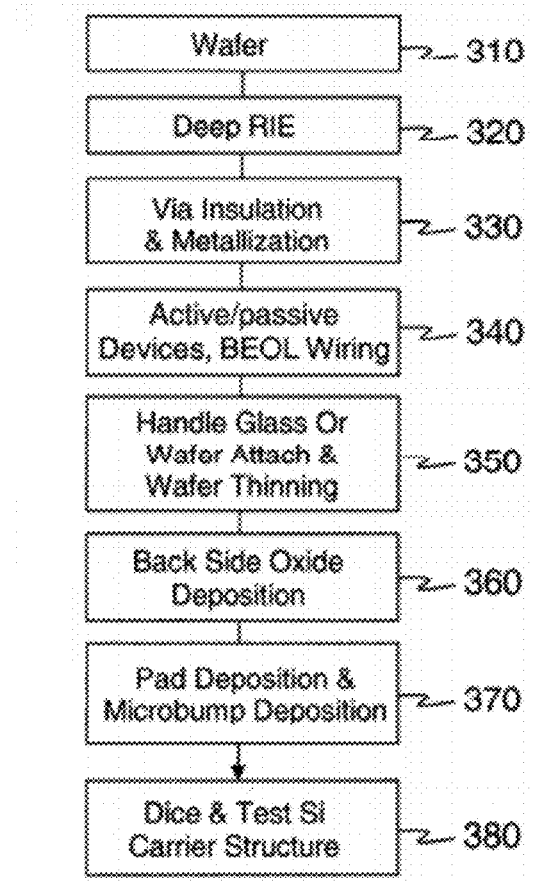
FIG. 3 is a flowchart illustrating a method of fabricating a silicon carrier structure, according to an exemplary embodiment of the present invention.

FIG. 3 is a flowchart illustrating a method of fabricating a silicon carrier structure, according to an exemplary embodiment of the present invention.

Referring to FIG. 3, a wafer 310 undergoes deep reactive ion etch (DRIE) 320 to form etched vertical holes in the silicon. In block 330, via insulation and metallization can be achieved using thermal oxidation to create an SiO2 layer or using SiOx or SiNx depositions such as plasma-enhanced chemical vapor deposition (PECVD) or other deposition techniques. A liner such as Ta/TaN and a metal conductor such as tungsten (W) can be deposited by CVD to form a vertical electrical connection or through silicon via (TSV).

In block 340, active and passive devices and back-end-of-line (BEOL) wiring are fabricated. For example, BEOL wiring can be deposited to form X-Y wiring interconnections for redistribution or space transformation connections, power and ground. For integrated decoupling capacitors and/or active circuit integrated fabrication into a silicon carrier structure, following via insulation in block 330, a temporary poly silicon is deposited, followed by circuits and/or decoupling capacitor (active and/or passive devices) processing using standard front-end-of-line (FEOL) processing, after which the poly-silicon is removed from the TSV and a liner/conductor of Ta/TaN and W can be deposited followed by BEOL wiring. The wafer can be finished with surface pads.

In block 350, a glass handle wafer is attached, for example, using a polymer adhesive, followed by wafer thinning where mechanical grinding, polish and/or RIE are used to thin the wafer. In block 360, the back side receives oxide deposition over exposed silicon, for example, using PECVD.

In block 370, surface pads and microbumps or copper interconnections are deposited, for example, using lithography and depositions or plating. In block 380, the silicon carriers are diced and tested to known specifications and are ready for further module assembly.

Figure 4:
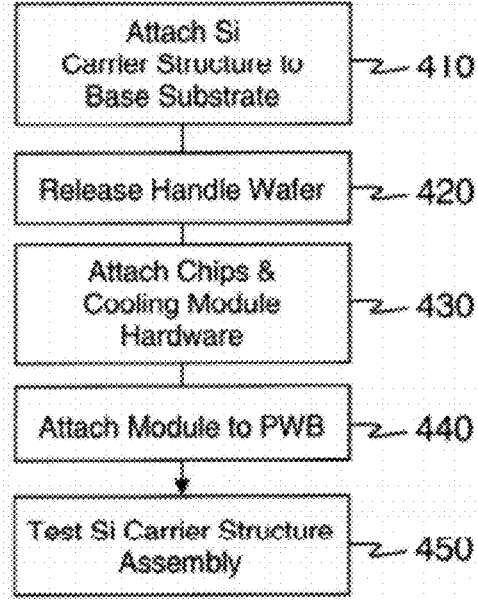
FIG. 4 is a flowchart illustrating a method of assembling a silicon structure, according to an exemplary embodiment of the present invention.

FIG. 4 is a flowchart illustrating a method of assembling a silicon carrier structure assembly, according to an exemplary embodiment of the present invention.

Referring to FIG. 4, a silicon carrier structure (e.g., 120 or 220) is attached to a substrate, such as base substrate 110 or 210, using solder reflow or copper to copper bonding, in block 410. Next, in block 420, the mechanical handler is removed. For example, the mechanical handler may be removed using a laser scan to release the adhesive or chemical release to dissolve the adhesive. The surface may be cleaned using oxygen ashing, chemical clean or other cleaning method to remove any residue.

In block 430, a single or multiple chips and cooling module hardware are attached to the Si carrier structure.

In block 440, the base substrate 110 or 210 is attached to the next level of packaging such as a system printed wiring board (PWB). For example, the substrate may be attached to the PWB using surface mount attach BGA or CGA or may be attached with a socket/LGA connection. The assembly undergoes test evaluation of the silicon carrier structure involving mounting into the tester to be ready for die or wafer testing, in block 450.

In an exemplary embodiment of the present invention, a signal can be traversed between circuits by leveraging Z interconnections in addition to X and Y wiring, and increased bandwidth and/or reduced latency may be achieved.

In various exemplary embodiments of the present invention, driver power may be reduced, for example, due to shorter interconnection lengths and lower resistance, capacitance (RC) circuits, use of adjacent flip-chip decoupling capacitance, finer pitch power grid, finer pitch chip and/or package I/O, with increased performance, lower test costs and/or supporting higher frequency system needs.

A silicon carrier structure for electronic packaging that includes through silicon connections, according to various exemplary embodiments of the present invention, can leverage use of smaller die, which are generally easier to yield during wafer manufacture compared to larger area chips of the same semiconductor technology and complexity and provide means to support shorter wiring lengths compared to two-dimensional silicon integration or traditional chip packaging.

Although exemplary embodiments of the present invention have been described in detail with reference to the accompanying drawings for the purpose of illustration and description, it is to be understood that the inventive processes and apparatus are not to be construed as limited thereby. It will be apparent to those of ordinary skill in the art that various modifications to the foregoing exemplary embodiments may be made without departing from the scope of the invention as defined by the appended claims, with equivalents of the claims to be included therein.

What is claimed is:

1. A silicon carrier structure for electronic packaging, comprising:
   a base substrate;
   a silicon carrier substrate disposed on the base substrate, wherein the silicon carrier includes a plurality of interconnections and at least one passive device including an electrostatic discharge (ESD) protective circuit;
   a memory chip disposed on the silicon carrier substrate and connected to the plurality of interconnections;
   a microprocessor chip disposed on the silicon carrier substrate and connected to the plurality of interconnections;
   an input/output chip disposed on the silicon carrier substrate and connected to the plurality of interconnections; and
   a clocking chip disposed on the silicon carrier substrate and connected to the plurality of interconnections.

2. The silicon carrier substrate of claim 1, wherein the at least one passive device further includes at least one decoupling capacitor.

3. The silicon carrier substrate of claim 1, wherein the at least one passive device further includes at least one resistor.

4. The silicon carrier substrate of claim 1, wherein the at least one passive device further includes at least one inductor.

5. The silicon carrier substrate of claim 1, wherein the interconnections have a pitch in the range of about 5 microns to about 50 microns.

6. The silicon carrier substrate of claim 1, further comprising at least one active device including a driver, a repeater and a buffer of a signal for propagation.

7. The silicon carrier substrate of claim 1, further comprising a switch chip disposed on the silicon carrier substrate and connected to the plurality of interconnections.

8. A silicon carrier structure for electronic packaging, comprising:
- a base substrate;
- a silicon carrier substrate disposed on the base substrate, wherein the silicon carrier includes a plurality of interconnections and at least one passive device and at least one active device;
- a memory chip disposed on the silicon carrier substrate and connected to the plurality of interconnections;
- a microprocessor chip disposed on the silicon carrier substrate and connected to the plurality of interconnections;
- an input/output chip disposed on the silicon carrier substrate and connected to the plurality of interconnections; and
- a clocking chip disposed on the silicon carrier substrate and connected to the plurality of interconnections.

9. The silicon carrier substrate of claim 8, wherein the at least one passive device includes an electrostatic discharge (ESD) protective circuit.

10. The silicon carrier substrate of claim 8, wherein the at least one passive device includes at least one decoupling capacitor.

11. The silicon carrier substrate of claim 8, wherein the at least one passive device includes at least one resistor.

12. The silicon carrier substrate of claim 8, wherein the at least one passive device includes at least one inductor.

13. The silicon carrier substrate of claim 8, wherein the interconnections have a pitch in the range of about 5 microns to about 50 microns.

14. The silicon carrier substrate of claim 8, wherein the at least one active device includes one of a driver, a repeater and a buffer of a signal for propagation.

15. The silicon carrier substrate of claim 8, further comprising a switch chip disposed on the silicon carrier substrate and connected to the plurality of interconnections.

\* \* \* \* \*